United States Patent [19]

Tsukada

[11] 4,205,274
[45] May 27, 1980

[54] POWER AMPLIFIER CIRCUIT

[75] Inventor: Keizo Tsukada, Kawaguchi, Japan

[73] Assignee: Sony Corporation, Tokyo, Japan

[21] Appl. No.: 7,219

[22] Filed: Jan. 29, 1979

[30] Foreign Application Priority Data

Jan. 24, 1978 [JP] Japan .................................. 53/6530
May 4, 1978 [JP] Japan ........................... 53/60511[U]
May 9, 1978 [JP] Japan ........................... 53/61978[U]

[51] Int. Cl.² .......................... H03F 3/26; H04B 1/06
[52] U.S. Cl. .................................. 330/276; 455/267;
455/154; 330/2; 330/271; 330/273; 330/296
[58] Field of Search .................. 330/2, 167, 196, 265,
330/267, 271, 273, 276, 296, 297; 325/424, 455, 492

[56] References Cited
U.S. PATENT DOCUMENTS 3,492,585  1/1970  Ludlam ........................... 330/196 X Primary Examiner—James B. Mullins
Attorney, Agent, or Firm—Hill, Van Santen, Steadman, Chiara & Simpson

[57] ABSTRACT

A power amplifier circuit is mainly composed of an amplifier including an input transistor, a driving transistor and a power amplifying transistor. This power amplifying transistor is connected at its output end to an output transformer the secondary winding of which is connected to a first adjusting means for adjusting an output impedance of the power amplifying transistor. A second adjusting means, which is interlocked with the first adjusting means, is provided on the current path of the driving transistor to adjust the value of an emitter resistance of the driving transistor, and the biasing voltage of the power amplifying transistor is obtained from the current path of the driving transistor, thus the power consumption of this circuit being reduced by the adjustment of the first and second adjusting means.

11 Claims, 3 Drawing Figures

POWER AMPLIFIER CIRCUIT

BACKGROUND OF THE INVENTION

1. Field of the Invention

The present invention relates to a power amplifier circuit, and particularly to an improved power amplifier circuit in which the power consumption can be reduced by the adjustment of adjusting means.

2. Description of the Prior Art

In a prior art power amplifier of, for example, a radio receiver including push-pull-connected power amplifying transistors, the primary side of an output transformer is adjusted in accordance with the volume control of the radio receiver to vary its output impedance so that the efficiency of the power amplifier may be adjusted to reduce its power consumption. In this case, the biasing voltage of the power amplifying transistors is always substantially constant, so that the power consumption relating to this biasing voltage can not be greatly reduced.

Further, because of employing the push-pull-connected power amplifying transistors, when the primary side of the output transformer is adjusted, both of the transistors must be also adjusted in a similar manner, so that particular design and control are required to make the circuit complicated.

SUMMARY OF THE INVENTION

In a power amplifier circuit of this invention, the bias of a power amplifying transistor is adjusted in association with the adjusting means for reducing its power consumption.

Accordingly, an object of this invention is to provide a power amplifier circuit free from the above mentioned drawbacks inherent to the prior art power amplifier.

Another object of this invention is to provide a power amplifier circuit in which an adjusting means is connected to the emitter electrode of a driving transistor to reduce the collector current of this transistor so that its power consumption can be decreased.

A further object of this invention is to provide a power amplifier circuit in which a power amplifying transistor is applied with a biasing voltage from a current path of a driving transistor to reduce the collector current of the power amplifying transistor so that its power consumption can be reduced.

A still further object of this invention is to provide a power amplifier circuit in which an output impedance adjusting means formed of a change-over switch is provided at the secondary side of an output transformer so that the collector current of a power amplifying transistor can be decreased and also the adjusting means can be simply formed.

Another and further object of this invention is to provide a power amplifier circuit in which even though the power consumption is reduced its characteristics may not be deteriorated or the deterioration of characteristics can be made inconspicuous.

The other objects, features and advantages of this invention will be apparent from the following description taken in conjunction with the accompanying drawings.

DESCRIPTION OF THE PREFERRED EMBODIMENTS

A description will hereinafter be given on embodiments of this invention with reference to the drawings.

Figure 1:
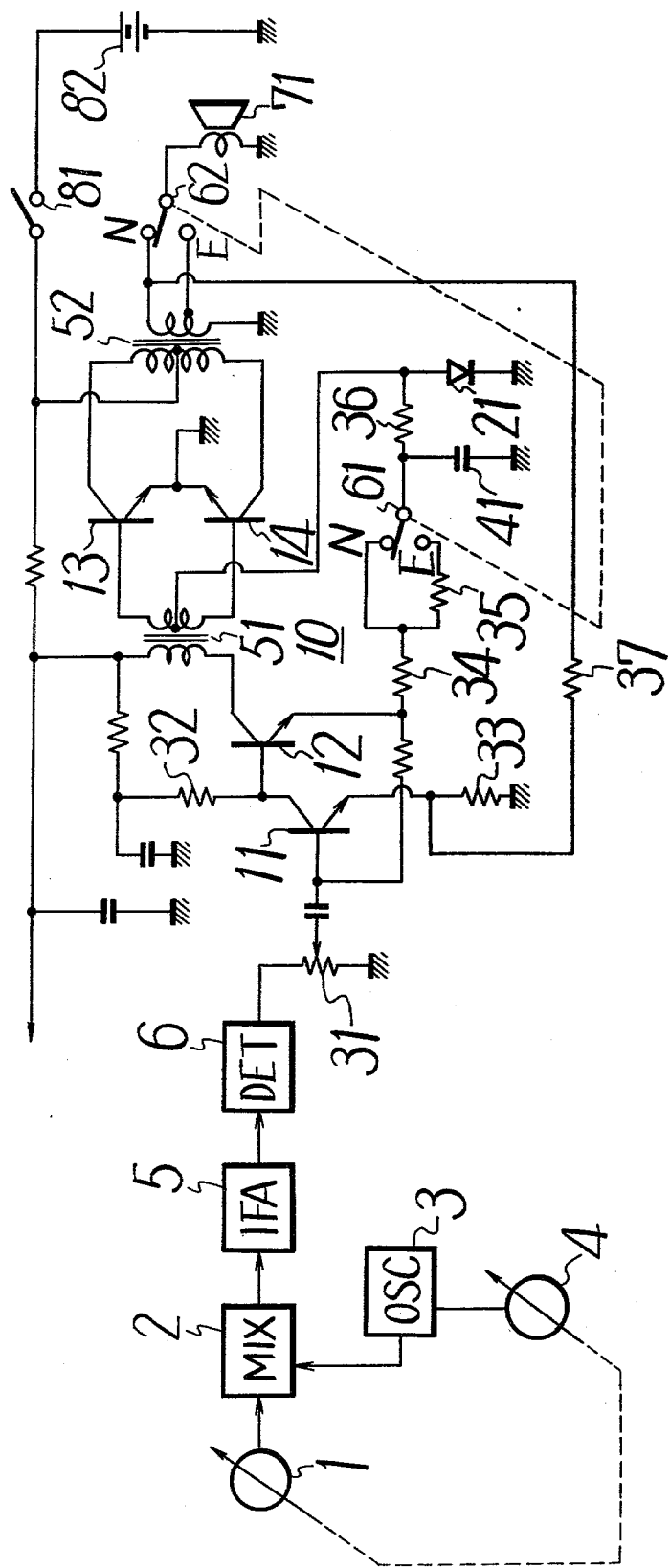
FIG. 1 is a circuit diagram showing a first embodiment of this invention.

FIG. 1 is a circuit diagram showing one embodiment of a power amplifier circuit of this invention, in which an input stage is composed of an antenna tuning circuit 1 which is tuned to a signal of radio frequency, a mixer 2, a local oscillator 3 having its resonance circuit 4, an intermediate frequency amplifier 5 and a detector circuit 6. An audio signal demodulated by the detector 6 is supplied through a variable resistor 31 for volume control to the base electrode of an input transistor 11 of an amplifier circuit 10.

The transistor 11 is connected at its collector electrode to a load resistor 32 and also connected at its emitter electrode through a resistor 33 to the ground. In other words, the transistor 11 is of an emitter-grounded configuration. The collector electrode of transistor 11 is also connected to the base electrode of a driving transistor 12. The collector electrode of transistor 12 is connected to a primary winding of a drive transformer 51, while the emitter electrode thereof is connected through a resistor 34 directly to an adjusting means, for example, a power saving or economizing switch 61 at its normal contact N and also through a resistor 35 to its economizing contact E, the movable contact of this switch 61 being grounded through a capacitor 41 and also grounded through a resistor 36 and, for example, a diode 21. These resistors, capacitor and diode are adapted to form an emitter circuit of the transistor 12.

Both ends of a secondary winding of the transformer 51 are respectively connected to the base electrodes of output transistors 13 and 14, and the middle tap of this secondary winding is connected to the connection point of resistor 36 and diode 21. The emitter electrodes of transistors 13 and 14 are respectively grounded and the collector electrodes thereof are respectively connected to both ends of a primary winding of an output transformer 52 the middle tap of which is connected to a power supply line. Thus, the transistors 13 and 14 are formed in B-class push-pull connection.

A secondary winding of the transformer 52 is grounded at its one end and connected at its other end to a normal contact N of an adjusting means, or power economizing switch 62 which is interlocked with the switch 61. An intermediate tap of this secondary winding is connected to a power economizing contact E of the switch 62. Between a movable contact of the switch 62 and the ground is connected a loudspeaker 71. In this case, the whole impedance of the secondary winding of the transformer 52 is selected to a value which is matched to that of the speaker 71, and also the intermediate tap thereof is arranged at a position which is, for example, ⅝ the turns of the secondary winding from its ground side. In addition, a resistor 37 for negative feedback is connected between the hot side of the secondary winding of transformer 52 and the emitter electrode of transistor 11. Further, 81 designates a power supply switch and 82 a battery for power supply.

With the above mentioned arrangement, when the switches 61 and 62 are each connected to the contact N, a normal operation is carried out. In other words, the resistors 34 and 36 and the diode 21 are operated as an emitter resistor of transistor 12 and also the capacitor 41 is operated as a bipass capacitor. Therefore, an audio signal from the variable resistor 31 is amplified by the transistors 11 and 12 in turn and then supplied through the transformer 51 to the transistors 13 and 14, respectively. Meanwhile, a DC voltage obtained at the diode 21 is fed through the secondary winding of transformer 51 to the transistors 13 and 14 as their base biasing voltages so that the transistors 13 and 14 will perform B-class push-pull operation. Accordingly, the audio signal from the transformer 51 is further amplified and fed through the transformer 52 to the speaker 71.

On the other hand, when the switches 61 and 62 are connected to the contact E, power economization will be achieved. That is, also in this case, the audio signal is similarly amplified and then supplied to the speaker 71. However, since the speaker 71 is connected to the intermediate tap of the secondary winding of transformer 52, the load impedance of transistors 13 and 14 becomes high and hence the collector currents of transistors 13 and 14 are decreased and also efficiency thereof is improved to decrease a current consumption of the battery 82.

Moreover, in this case, the resistor 35 is inserted in series to the emitter resistors of transistor 12, so that the collector currents of transistors 11 and 12 are decreased to reduce the current consumption of battery 82 similarly. Also, the reduction of the collector current of transistor 12 acts to lower the voltage across diode 21 so that the collector currents of transistors 13 and 14 are decreased thereby reducing the current consumption of battery 82.

In this case, when the collector current of transistor 12 is decreased, the output of transistor 12 for driving the transistors 13 and 14 becomes small. In this invention, however, the load impedance of transistors 13 and 14 becomes large to lower the maximum output of transistors 13 and 14, so that the lowered output of transistor 12 is no problem. Further, if the collector currents of transistors 13 and 14 are decreased, cross-over distortion is increased. However, the load impedance of transistors 13 and 14 becomes great at this time, so that the cross-over distortion is not increased, or its increase will not be noticeable.

In addition, when saving power, the load impedance of transistors 13 and 14 becomes great as mentioned above, so that net gains of the transistors 13 and 14 are increased. While the negative feedback voltage is stepped up by the secondary winding of transformer 52, so that the negative feedback amount becomes large and consequently the circuit should be unstable. In this invention, however, since the resistor 35 is connected in series to the emitter electrode of transistor 12 so as to be applied with current negative feedback, the gain of transistor 12 is decreased and hence the circuit will not become unstable. Contrarily, various characteristics thereof will be improved corresponding to the increment of current negative feedback.

Figure 2:
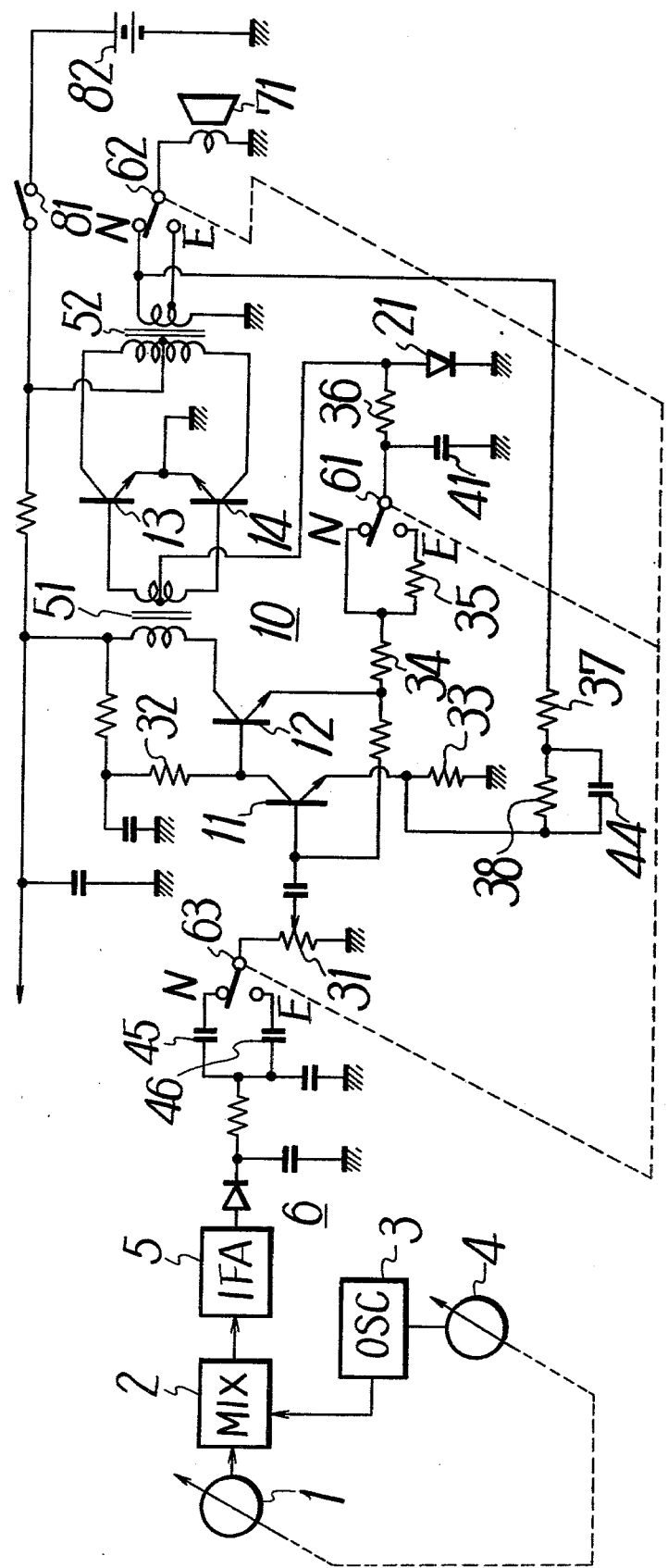
FIG. 2 is a circuit diagram showing a second embodiment of this invention.

FIG. 2 is a circuit diagram showing an embodiment which is suitable for a compact radio receiver or tape recorder aimed at tone quality. In FIG. 2, elements corresponding to those in FIG. 1 will be indicated by the same reference numerals with the description therefor being omitted.

In FIG. 2, the output end of the detector 6, which is shown in another form, is connected through a capacitor 45 having a relatively large capacitance to a normal contact N of a tone adjusting means, for example, a switch 63, and also through a capacitor 46 having a relatively small capacitance to the economizing contact E of switch 63. The movable contact of switch 63 is then connected through the volume controlling variable resistor 31 to the base electrode of transistor 11. The switch 63 is interlocked with the switches 61 and 62.

In this embodiment, a parallel circuit of a negative feedback resistor 38 and a capacitor 44 is connected in series to the resistor 37 in the negative feedback loop between the hot side of the secondary winding of transformer 52 and the emitter electrode of transistor 11. In this case, if values of these elements 37, 38 and 44 are properly selected, the frequency characteristic of the amplifier 10 will be intensified in low frequency range.

With the above construction, when the switches 61, 62 and 63 are each connected to the contact N, the amplifier 10 performs the normal operation, that is, the same operation as that of the embodiment of FIG. 1, wherein the switches 61 and 62 are each connected to the contact N. Particularly, in this case, since the audio signal from the detector circuit 6 is supplied through the capacitor 45 having relatively large capacitance to the amplifier 10, this audio signal to be supplied to the amplifier 10 contains not only a middle and high frequency component but also a low frequency component. Then, the low frequency characteristic of the amplifier 10 is intensified by the resistors 37 and 38 and capacitor 44. Thus, the loudspeaker 71 is applied with an audio signal with its low frequency range being intensified, so that the speaker 71 will reproduce a normal sound, or a sound which is relatively balanced in tone quality in spite of the small size of the speaker or the receiver.

On the other hand, when the switches 61, 62 and 63 are each connected to the contact E, the amplifier 10 performs the power saving operation, that is, reduces the power consumption in the same manner as the embodiment of FIG. 1 in which the switches 61 and 62 are each connected to the contact E. In this embodiment, however, since the audio signal from the detector circuit 6 is supplied to the amplifier 10 through the capacitor 46 having relatively small capacitance, this audio signal fed to the amplifier 10 contains only a middle and high frequency component without a low frequency component. Accordingly, even though the amplifier 10 has such a characteristic as being intensified in low frequency range, an audio signal supplied to the speaker 71 will have a flat or attenuated low frequency characteristic and this signal is reproduced from the speaker 71 as a sound. In this case, a reproduced sound from the speaker does not contain a low frequency range. However, since the sense of volume is mainly determined by the level of middle and high frequency range, even though the low frequency range is not reproduced, the reduction in volume will not be sensed. Besides, since the audio signal supplied to the amplifier 10 contains no low frequency range, the current consumption in the amplifier 10 is decreased, and also in this case the power will not be consumed wastefully.

Figure 3:
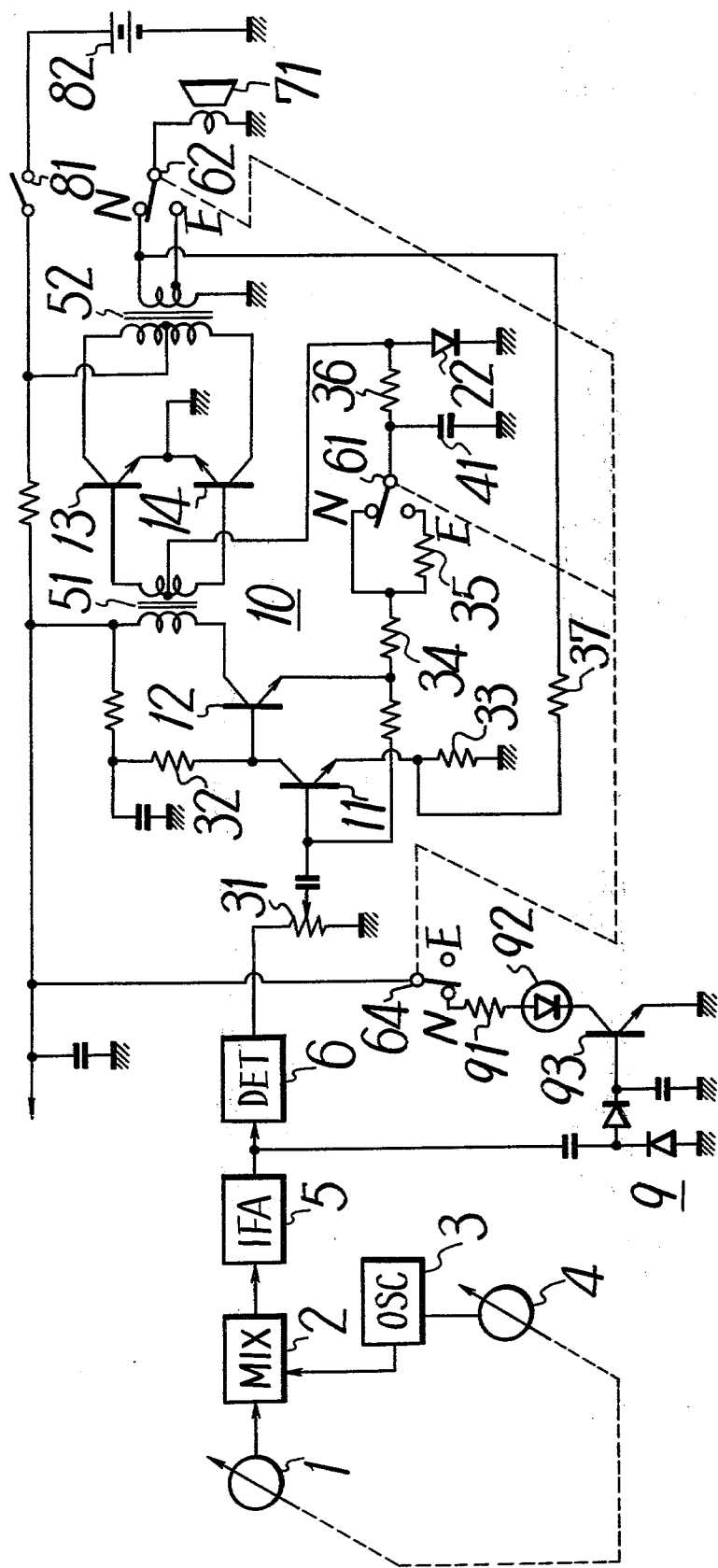
FIG. 3 is a circuit diagram showing a third embodiment of this invention.

FIG. 3 is a circuit diagram showing a further embodiment of this invention suitable for use in a radio receiver having tuning indicator function, in which portions corresponding to those of FIG. 1 will be shown by like reference numerals and a detailed description thereof will be omitted.

In the circuit of FIG. 3, a rectifier circuit 9 for detecting a tuning indicating signal is connected to the intermediate frequency amplifier 5 so that an intermediate frequency signal is applied thereto. A rectified output from the rectifier circuit 9 is supplied to the base electrode of a transistor 93. A switch 64 acts to change over ON and OFF of tuning indicator means, and is adapted to interlock with the switches 61 and 62. A normal contact N of this switch 64 is connected through a resistor 91 to the anode of a light emitting diode (LED) 92 for tuning indication, while a contact E thereof is made free or neutral. The cathode of LED 92 is connected to the collector electrode of transistor 93 while the emitter electrode thereof is grounded. On the other hand, an audio signal demodulated by the detector 6 is adapted to be supplied through the volume controlling variable resistor 31 to the amplifier 10.

With such an arrangement, when the switches 61, 62 and 64 are each connected to the contact N, the amplifier 10 performs the normal operation, that is, the same operation as that of the embodiment in FIG. 1, wherein the switches 61 and 62 are each connected to the contact N. In this embodiment, however, when the tuning circuit 1 and the resonance circuit 4 are both not properly tuned, an intermediate frequency signal is not produced from the intermediate frequency amplifier 5, so that the rectifier circuit 9 produces no rectified output thereby to make the transistor 93 nonconductive. As a result, the LED 9 will not be lit. However, when the tuning circuit 1 and the resonance circuit 4 are both properly tuned, the intermediate frequency amplifier 5 delivers an intermediate frequency signal to the rectifier circuit 9 to derive therefrom a rectified output. This output is applied to the base electrode of transistor 93 to turn the same on so that the LED 92 is lit to indicate the tuned condition.

On the other hand, when the switches 61, 62 and 64 are each connected to the contact E, the amplifier 10 performs the power saving operation in the same manner as in the embodiment of FIG. 1, wherein the switches 61 and 62 are each connected to the contact E. Further, in this embodiment, even if a proper tuning is attained, the LED 92 is not energized due to the neutral state of the switch 64, so that the current consumption of battery 82 upon tuning is considered to be zero.

As mentioned above, according to this invention, in the case that a large amount of output is not required, with at least the switches 61 and 62 being changed over to the contact E, power economization can be achieved, or the battery 82 can be used for a long time. Further, a large amount of output can be obtained by changing-over the switches 61 and 62 to contact N as occasion demands. Besides, even in either case, the power amplifier circuit of this invention can achieve a superior amplifying operation without deteriorating characteristics.

While a few embodiments of this invention have been illustrated and described in detail, it is particularly understood that the invention is not limited thereto or thereby.

It will be apparent to those skilled in the art that many modifications and variations may be effected without departing from the spirit and scope of the novel concepts of the present invention.

I claim as my invention:
1. A power amplifier circuit comprising:
   (a) an amplifying circuit including an input transistor, a driving transistor having a resistor in its emitter circuit, and a power amplifying transistor, each of said transistors having input, output and common electrodes;
   (b) a loudspeaker;
   (c) an output transformer provided between said power amplifying transistor and said loudspeaker;
   (d) a first adjusting means connected to said output transformer for adjusting the output impedance of said output transformer;
   (e) a second adjusting means for adjusting the value of said emitter resistor of said driving transistor, said second adjusting means being interlocked with said first adjusting means; and
   (f) a biasing means connected to said emitter resistor of said driving transistor and for producing a biasing voltage for said power amplifying transistor.
2. A power amplifier circuit according to claim 1, which is a battery-driven circuit.
3. A power amplifier circuit according to claim 1, in which said first adjusting means is provided at the secondary side of said output transformer.
4. A power amplifier circuit according to claim 1, in which said first adjusting means and said second adjusting means are each formed of a change-over switch.
5. A power amplifier circuit according to claim 4, which further includes a tuning indicator means and a switching means for changing-over ON and OFF of said tuning indicator means, said switching means being interlocked with said first and second adjusting means.
6. A power amplifier circuit according to claim 1, which further includes a tone adjusting means, said tone adjusting means being interlocked with said first and second adjusting means.
7. A power amplifier circuit according to claim 1, in which said power amplifying transistor is formed in push-pull configuration.
8. A power amplifier circuit comprising:
   (a) an input stage;
   (b) an amplifying stage connected to said input stage and including input, driving and output transistors each having base, collector and emitter electrodes;
   (c) a battery source for supplying a DC voltage to said transistors;
   (d) a load coupled to said output transistor;
   (e) an output transformer connected between said output transistor and said load;
   (f) a first adjusting means connected to said output transformer and for varying an output impedance of said output transistor;
   (g) an emitter circuit connected to the emitter electrode of said driving transistor and including a resistor means;
   (h) a biasing means connected to said emitter circuit and for providing a biasing voltage to be supplied to the base electrode of said output transistor; and
   (i) a second adjusting means for varying the value of said resistor means of said emitter circuit, said second adjusting means being interlocked with said first adjusting means.
9. A power amplifier circuit according to claim 8, in which said output transformer comprises a primary winding connected to said output transistor and a secondary winding, said secondary winding having first and second taps to be selectively connected to said load through said first adjusting means, said first tap being connected to said input transistor through a resistor to form a negative feedback loop.
10. A power amplifier circuit according to claim 8, in which said input stage includes a tone control circuit connected to said base electrode of said input transistor, said tone control circuit comprising first and second capacitors connected in parallel with each other, a third adjusting means selectively coupling said first and second capacitors to said input transistor, said third adjusting means being interlocked with said first and second adjusting means.

11. A power amplifier circuit according to claim 8, in which said input stage includes an intermediate frequency amplifier for amplifying a signal received by a radio frequency circuit, a detector for detecting an audio signal to be supplied to said input transistor, and a tuning indicator circuit connected to said intermediate frequency amplifier, said tuning indicator circuit comprising a rectifier, an active element applied with a rectified signal produced by said rectifier and an indicator means connected to said active element, wherein said indicator means is selectively applied with a DC voltage from said battery source through a switch means, said switch means being interlocked with said first and second adjusting means.

* * * * *